(12) United States Patent
Lee et al.

(10) Patent No.: US 9,924,595 B2
(45) Date of Patent: Mar. 20, 2018

(54) CABLE FOR ALTERNATIVE INTERCONNECT ATTACHEMENT

(71) Applicant: Intel Corporation, Santa Clara, CA (US)

(72) Inventors: Beom-Taek Lee, Mountain View, CA (US); Raul Enriquez Shibayama, Zapopan (MX)

(73) Assignee: INTEL CORPORATION, Santa Clara ( * ) Notice: Subject to any disclaimer, the term of this patent is extended or adjusted under 35 U.S.C. 154(b) by 275 days.

(21) Appl. No.: 14/567,402

(22) Filed: Dec. 11, 2014

(65) Prior Publication Data

US 2016/0174373 A1 Jun. 16, 2016

(51) Int. Cl.
| | |
|---|---|
| H05K 1/00 | (2006.01) |
| H05K 1/18 | (2006.01) |
| H05K 7/00 | (2006.01) |
| H05K 1/11 | (2006.01) |
| H05K 1/14 | (2006.01) |
| H01R 12/58 | (2011.01) |
| H01R 12/71 | (2011.01) |
| H01R 31/06 | (2006.01) |

(52) U.S. Cl.
CPC ............ *H05K 1/115* (2013.01); *H05K 1/147* (2013.01); *H05K 1/184* (2013.01); *H01R 12/585* (2013.01); *H01R 12/718* (2013.01); *H01R 31/06* (2013.01); *H05K 2201/1059* (2013.01); *H05K 2201/10295* (2013.01); *H05K 2201/10356* (2013.01); *H05K 2201/10378* (2013.01); *H05K 2201/10545* (2013.01); *H05K 2201/10704* (2013.01); *H05K 2201/10901* (2013.01)

(58) Field of Classification Search
USPC .................................................. 361/748, 760
See application file for complete search history.

(56) References Cited

U.S. PATENT DOCUMENTS

| | | | | |
|---|---|---|---|---|
| 2007/0085625 A1* | 4/2007 | Cordes | ...................... | G06F 1/18 333/24 C |
| 2008/0087995 A1* | 4/2008 | Yang | ................... | H01L 23/4985 257/676 |
| 2014/0049292 A1* | 2/2014 | Popescu | ................... | G02B 6/43 327/100 |

* cited by examiner

*Primary Examiner* — Andargie M Aychillhum
(74) *Attorney, Agent, or Firm* — Womble Bond Dickinson (US) LLP (57) ABSTRACT

In one embodiment, the apparatus comprises: a substrate having a first side and a second side, the second side being on an opposite side of the substrate from the first side, where the substrate has a first location on the first side at which an semiconductor package is to be coupled; and a cable coupled to the substrate on the second side of the substrate at a second location on the second side, the second location being at least partially below the first location.

22 Claims, 5 Drawing Sheets

CABLE FOR ALTERNATIVE INTERCONNECT ATTACHEMENT

FIELD OF THE INVENTION

Embodiment of the present invention relate to the field of electrical interconnects; more particularly, embodiments of the present invention relate to use of an alternative interconnect (e.g., a cable) instead of an interconnect through a substrate (e.g., a printed circuit board (PCB)) when the interconnect through the substrate is too long to meet the loss and/or noise constraints for a high speed signaling platform.

BACKGROUND OF THE INVENTION

Future server products require higher bandwidth interconnects on their platforms such as, for example, PCI Express Gen4 (16 Gbps), 100 GbE (4×25 Gbps), OIF-CEI-25G-LR, etc. These high speed interconnects use very short PCB trace length with FR4 Printed Circuit Board (PCB) material. However, there may be mismatches between the maximum PCB trace length achievable for a particular platform and the required PCB trace length for that platform. For example, Table 1 below shows the platform requirement for PCI Express Gen4 and 25 GbE.

TABLE 1

| Interconnects | Required PCB trace length ["] | Comment |
|---|---|---|
| PCI Express Gen4 | 20 | |
| 25GbE | 40 | Backplane configuration |

With improved FR4 PCB material it is difficult to meet PCI Express Gen4 (PCIe4) and 25 GbE trace length requirements on high volume server platform products.

In order to reduce the gap between the desired trace length and those that are feasible, the channel loss needs to be reduced significantly and/or the repeater needs to be inserted in between two components on the channel (e.g., host and end agents). To reduce channel loss, a lower loss PCB material may be used as the substrate between the two components. This provides a great deal of improvement. Low loss PCB material is very close to meet PCIe4 trace length requirement but still does not meet the 20" requirement. Also, low loss PCB material still cannot meet the 25 GbE trace length requirement. Very low loss PCB material can meet the PCIe4 trace length requirement with good margin. Also, very low loss PCB material can meet the 25 GbE trace length requirement of 40" with very smooth surface treatment on copper and very wide signal traces. However, it is expensive to use low loss and very low loss PCB material and adds significant bill of materials (BOM) cost to the system. Furthermore, very low loss PCB cost is intolerable for high volume server platform products. Moreover, there are situations where even the use of a low loss PCB and/or very low loss PCB cannot meet the platform requirements. For example, PCI Express Gen4 cannot meet the 20" requirement with high volume, low loss PCB material. Similarly, 25 GbE also cannot meet the platform requirements with very low loss PCB material where non-smooth copper surface and/or non-wide signal traces are used.

The use of a repeater can solve the issue of not meeting the signal trace length requirement for the platforms. However, the inclusion of a repeater adds cost, increases power requirements and requires more PCB area.

BRIEF DESCRIPTION OF THE DRAWINGS

The present invention will be understood more fully from the detailed description given below and from the accompanying drawings of various embodiments of the invention, which, however, should not be taken to limit the invention to the specific embodiments, but are for explanation and understanding only.

DETAILED DESCRIPTION OF THE PRESENT INVENTION

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Embodiments set forth in the claims encompass all available equivalents of those claims.

Orientation terminology, such as "horizontal," as used in this application is defined with respect to a plane parallel to the conventional plane or surface of a substrate or printed circuit board (PCB), regardless of the orientation of the substrate or PCB. The term "vertical" refers to a direction perpendicular to the horizontal as defined above. Prepositions, such as "top," "bottom," "below," "on," "side", "higher," "lower," "over," and "under" are defined with respect to the conventional plane or surface being on the top surface of the substrate, regardless of the orientation of the electrical interconnect or electronic package.

Embodiments of the invention include an assembly or topology having a substrate (e.g., PCB) with two sides (e.g., a top side and bottom side opposite the top side). The substrate has a location on its top side to which a semiconductor package (e.g., integrated circuit (IC)) may be coupled. The apparatus includes a cable (e.g., a flex cable, a coax cable, a twin-ax cable, etc.) or other low loss transmission medium coupled to the substrate on the bottom side of the substrate at a second location that is at least partially below the location on the top side where the semiconductor package is to be coupled (e.g., at a shadow via). In this manner, the cable is coupled to the semiconductor package and may be communicably coupled to the semiconductor package.

In one embodiment, the cable is coupled to the substrate via a press fit connection. The press fit connection includes press fit pins having press fit tails extend through press fit pin vias in the substrate. In one embodiment, the press fit pins are attached to the bottom side of the substrate at one or both of a package shadow via or a connector shadow via. The shadow vias match, at least partially, the pin pattern of the semiconductor package on the other side of the substrate. That is, they match the pin layout of the semiconductor package. In one embodiment, the press fit pins couple a socket to the substrate. Alternatively, instead of using a press fit connection, another type of connection scheme could be used, such as, for example, a surface mount connection.

In one embodiment, the assembly uses a press-fit header on coax or twin-ax cable that is attached to the backside of PCB on the semiconductor package shadow via and/or the connector shadow via.

This assembly, as well as others described herein, reduce the channel insertion loss significantly and, thus, meet the platform landing zone requirements for high speed signaling such as is used, for example, in PCI Express Gen4, 25 GbE, etc. The use of a cable (e.g., a flex cable, a coax cable, a twin-ax cable, etc.) directly attached to PCB on the backside of semiconductor package shadow provides for a low loss channel that enables achieving a higher data rate, in contrast to the channel loss through the PCB.

Figure 1:
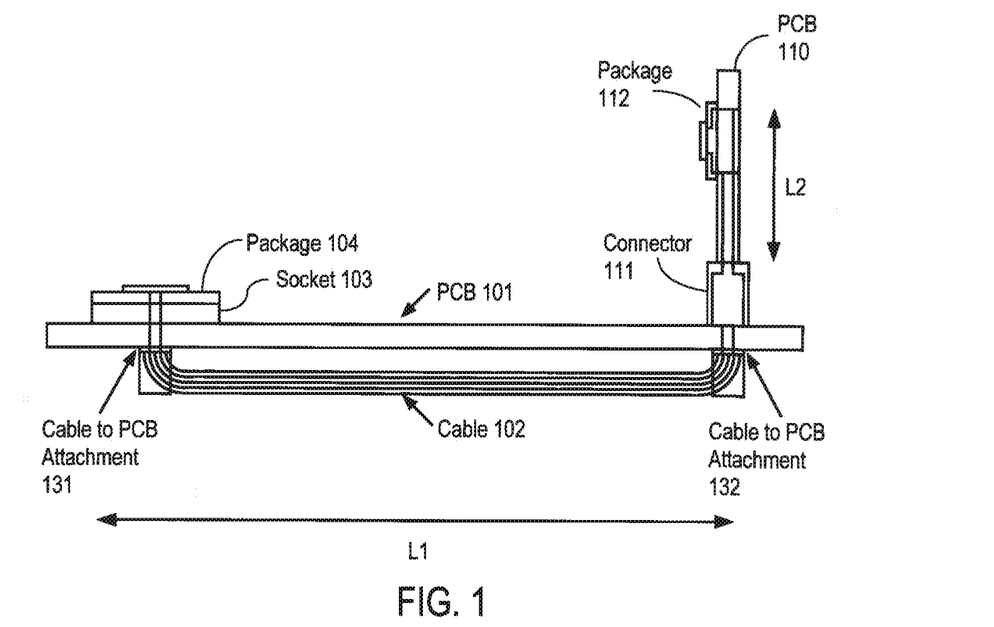
FIG. 1 illustrates one embodiment of a PCI Express topology with alternative channel on bottom side.

FIG. 1 shows a side view of one embodiment of a topology with coax cable attached to the backside of a substrate (e.g., a PCB). In one embodiment, the topology is a PCI Express topology. In one embodiment, the cable is attached to the substrate at the package shadow via.

Referring to FIG. 1, PCB 101 is connected via connector 111 to PCB 110. In one embodiment, PCB 101 is a central processing unit (CPU) board and PCB 110 is an add-in card that includes a semiconductor package 112 (e.g., integrated circuit (IC)), which is attached and communicably coupled to PCB 110, which form a PCI Express topology. A socket 103 is attached to the top side of PCB 101. Semiconductor package 104 (e.g., an IC) is attached to socket 103, such that package 104 is communicably coupled to PCB 101.

Cable 102 is also coupled to the bottom side of PCB 101 in two locations using cable-to-PCB attachment units 131 and 132.

In one embodiment, the topology of FIG. 1 is a PCI Express Gen4 topology. A PCI Express Gen4 channel assumes a 28 dB budget from transmitter (Tx) to receiver (Rx) including pad capacitance and consists of 8 dB for package and pad capacitance, 1 dB for connector, via and AC capacitor, and 19 dB for PCB boards. Of the 19 dB board budget, 13.7 dB is used for baseboard and 5.3 dB is used for add-in card (AIC). In such a configuration, using a PCB as its interconnect, the channel can be at most a length of 10" on the baseboard and 4" on AIC with mid loss PCB. However, the server platform requires a length of 16" for the baseboard to meet the landing zone target. In one embodiment in which the topology of FIG. 1 is a PCI Express Gen4 topology, if a 30AWG twin-ax cable is used for baseboard, then it can achieve >60" solution space, which easily meets the platform requirement.

Figure 2:
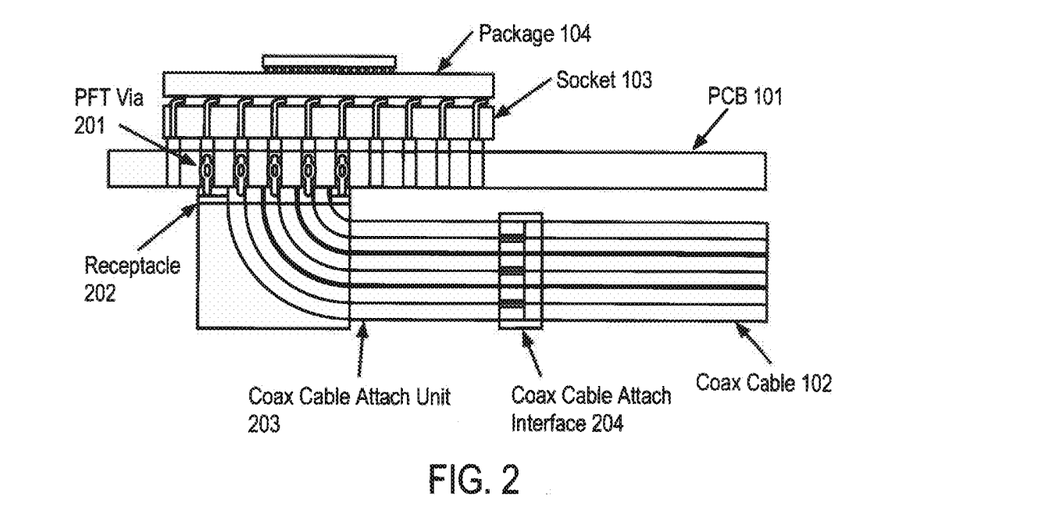
FIG. 2 illustrates one embodiment of a coax (or twin-ax) cable coupling to a substrate (e.g., a printed circuit board (PCB)) through a backside connector.

In one embodiment, the cable is coupled to the substrate (e.g., PCB) via a connector (receptacle) and a cable attachment unit. FIG. 2 illustrates one embodiment of a cable (e.g., a flex cable, a coax cable, a twin-ax cable, etc.) coupling to a substrate (e.g., a PCB) through a backside connector. The topology in FIG. 2 uses press-fit connection to the PCB in order to connect the cable to the PCB directly.

Referring to FIG. 2, semiconductor package 104 is coupled through vias in socket 104 to PCB 101. The connections through socket 103 are made to PCB 101 (and to cable 102) using press-fit vias (extending through PFT vias 201). A coax cable attach unit 203 couples coax cable 102 to PCB 101. Cable 102 is coupled to coax cable attach unit 203 via a coax cable attach interface 204. In one embodiment, coax cable attach interface 204 mates coax cable 102 and coax cable attach unit 203. The interface can be achieved in many ways. For example, coax cable 102 can be directly connected with coax cable attach unit 203 without an interface or assembled with coax cable attach unit 203 using male/female connector or any contact mechanisms. In one embodiment, coax cable attach unit 203 is an assembly that communicably couples cable 102 and the press-fit-tails (PFTs) of press fit pins in PFT vias 201 through receptacle 202. Receptacle 202 may comprises a connector and/or molding to provide mechanical stability. In one embodiment, coax cable attach unit 203 is attached to the backside, or bottom, of PCB 101 at the semiconductor package shadow via and/or connector shadow via. Coax cable attach unit 203 is preferred over a bulky commercial connector header and receptacle.

In one embodiment, cable attach unit 203 comprises press-fit pin, receptacle and built coax or twin-ax pattern that maps the cable signals conductors to the package pin-out of package 104 or connector pin-out of socket 103. In one embodiment, the press-fit pins are parts of the cable attachment unit, which will be plugged into the semiconductor package shadow vias on PCB. Instead of press-fit pins the cable attachment unit can have the surface mounting pads with solder balls. Thus, it can be attached to the backside of PCB through a soldering process. Pressurized contact technology can be used as an alternative instead of press-fit pins and a surface mounting soldering process.

In one embodiment, the cable attach unit and connection scheme of FIG. 2 is used to attach the other end of the cable to PCB 101 at another location on the backside of PCB 101.

Note that while the embodiment of FIG. 2 sets for that cable attach unit 203 is a coax cable attachment unit, embodiments are not limited to the use of a coax cable and coax cable attachment unit and may be used with other cables and cable attachment units, such as, for example those for flex cables, twin-ax cables, etc.

The use of cable 102 and cable attach unit 203 enables both a low loss channel and a compact form factor, which is in contrast to existing commercial high performance connectors that are large and have pin-outs that are pre-defined and do not match to the package shadow via pattern.

Table 2 compares PCB loss and twin-ax cable loss. Twin-ax cable has very low loss comparing to PCB. For example, twin-ax cable can reach 100" where the use of a mid loss PCB can reach only 10", twin-ax cable can reach 75" where the use of a low loss PCB can reach only 10", and twin-ax cable can reach 40" where the use of a very low loss PCB can reach only 10".

TABLE 2

| | Loss per inch [dB/in] @ 12.5 GHz | Note |
|---|---|---|
| Mid loss FR4 PCB | 2.0 | Volume server platform |
| Low loss PCB | 1.5 | High end server platform |
| Very low loss PCB | 0.8~1.0 | High cost low volume platform |
| 30AWG twin-ax cable | 0.2 | Twin-ax cable |

Embodiments of the assemblies described herein have one or more of several advantages over existing solutions. These include i) providing a compact form factor for the coax or twin-ax attach assembly, ii) providing a reduced or minimum loss channel for both package and PCB alternatives, and iii) helping the platform to use mid loss or standard FR4 PCB, thereby facilitating low system cost.

In one embodiment, attaching a cable attach unit to the backside of a PCB eliminates the via stub effect. Also, the package vertical path, socket and PCB via are continuously connected with the same signal-to-ground pin-out, thereby allowing implementation of crosstalk mitigation schemes.

In one embodiment, the cable attach unit is assembled in any location on package shadow via. This flexibility is helpful in reducing package trace length significantly as the target signal pin can be located near the signal C4 bump location. Thus, the channel loss can be reduced further by reducing the package trace loss.

The use of a cable and a cable attach unit to attach the cable to a substrate is not critical for all input/output interconnects. In one embodiment, the cable is only used for critical I/O interconnects (e.g., 2 port 25 GbE has 2×4×2=16 signaling pairs). In such a case, other relatively low speed I/O interconnects can use the low cost PCB technology. By balancing between using a cable and a cable attach unit for only some interconnects along with using low cost PCB technology for other I/O interconnects can cause the overall system cost can be reduced.

The techniques described herein are applicable any high speed I/O interconnects that do not meet the platform landing zone requirement. These interconnects include, but are not limited to, PCI Express Gen4 (16 Gbps), 25 Gbit Ethernet, OIF-CEI-25G-LR, etc. In one embodiment, a length of a trace in the substrate between the semiconductor package and the second semiconductor component used for communication between two components exceeds that which is necessary to meet platform landing zone requirements for the apparatus, and thus the cable is used to meet the platform landing zone requirements.

Table 3 compares the eye margins of a 1-connector PCIe3 channel with different channel insertion loss. Landing zone with actual PCB technology is in the 25 dB range where required channel performance (0 mV/0 ps) is barely met. It is a need for upcoming buses (PCI Express Gen4, 25 GbE, etc.) to provide better landing zone solution. The techniques described herein enable landing zone solutions with loss in the 20 dB range, while the actual PCB technology is maintained.

TABLE 3

| Channel Insertion Loss (dB @ 4 GHz) | Eye Height (mV) | Eye Width (ps) |
| --- | --- | --- |
| 20 | 25 | 14 |
| 25 | 2 | 1.4 |
| 30 | −15 | −8.5 |

Figure 3:
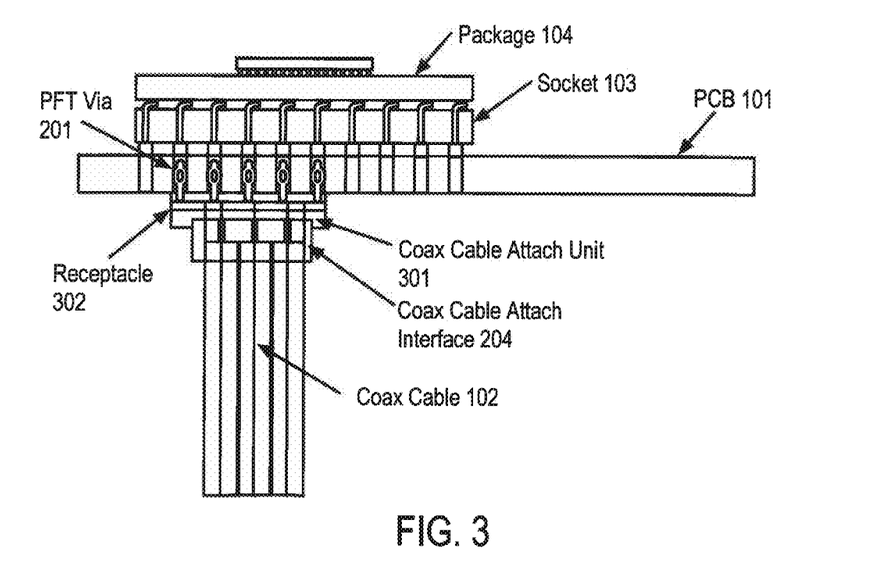
FIG. 3 is another alternative embodiment for coupling a cable to a PCB using a coax cable attach unit form factor.

The cable attachment unit does not have to connect the cable to a substrate (e.g., PCB) so that the position of the cable when attached to the substrate runs parallel to the substrate as shown in FIG. 2. FIG. 3 is another alternative embodiment for coupling a cable to a PCB using a different coax cable attach unit form factor. Referring to FIG. 3, the coax cable attach unit 301 is coupled to coax cable 102 via a coax cable attach interface 204 and is coupled to press-fit tails of press fit pins extending through PFT vias 201 of PCB 101 using receptacle 302 (e.g., connector) so that coax cable 102 is positioned perpendicular with respect to PCB 101. Other arrangements are also possible using different cable attachment units so that any position between a cable and the substrate may be achieved.

Figure 4:
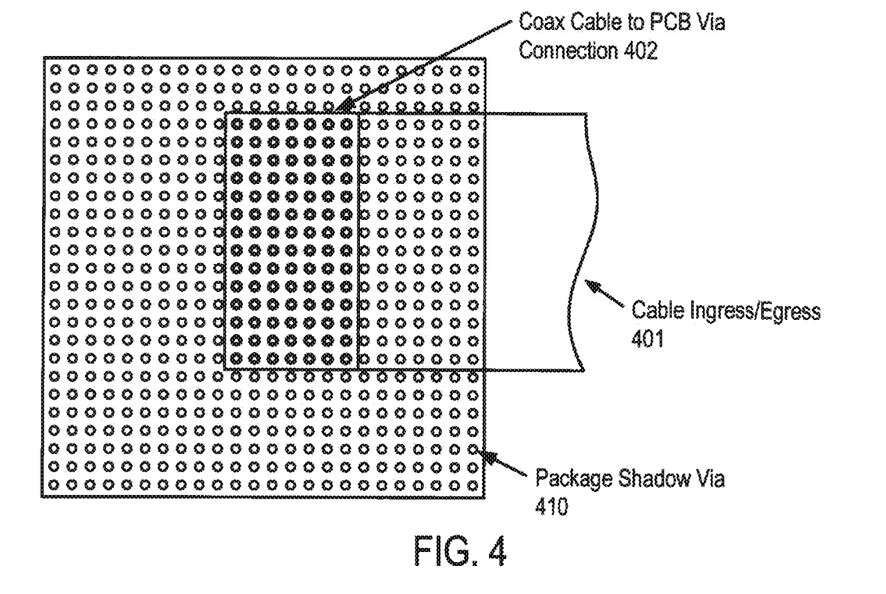
FIG. 4 illustrates one embodiment of a package shadow via with a coax cable attached thereto.

FIG. 4 illustrates a bottom view of one embodiment of a package shadow via with cable attach unit and cable ingress/egress. Referring to FIG. 4, a coax cable attach unit 402 provides a connection of a cable through cable ingress/egress 401 to a semiconductor package (not shown) through package shadow via 410. In one embodiment, the vias in the package shadow via 410 match all or at least the portion of the package pin out to which the cable is interfacing. In this coupling, 16 differential pairs are shown and can provide coverage for 2×4×25 Gbps links. It would be apparent to one skilled in the art, that other pin patterns may be used in the coupling of a cable to a semiconductor package by way of a package shadow via such as package shadow via 410 using a cable attach unit.

As discussed above, a cable can be attached to the topside of a substrate. This may be useful when there is no room for components to be attached to the backside of a substrate in certain system or components are only being attached to the substrate using a top side pick and place equipment. Note that this approach may not reduce package trace length and may add challenges with respect to component placement on the top side of the substrate. However, this configuration can help to extend the channel length significantly more than standard PCB channel configuration.

Figure 5:
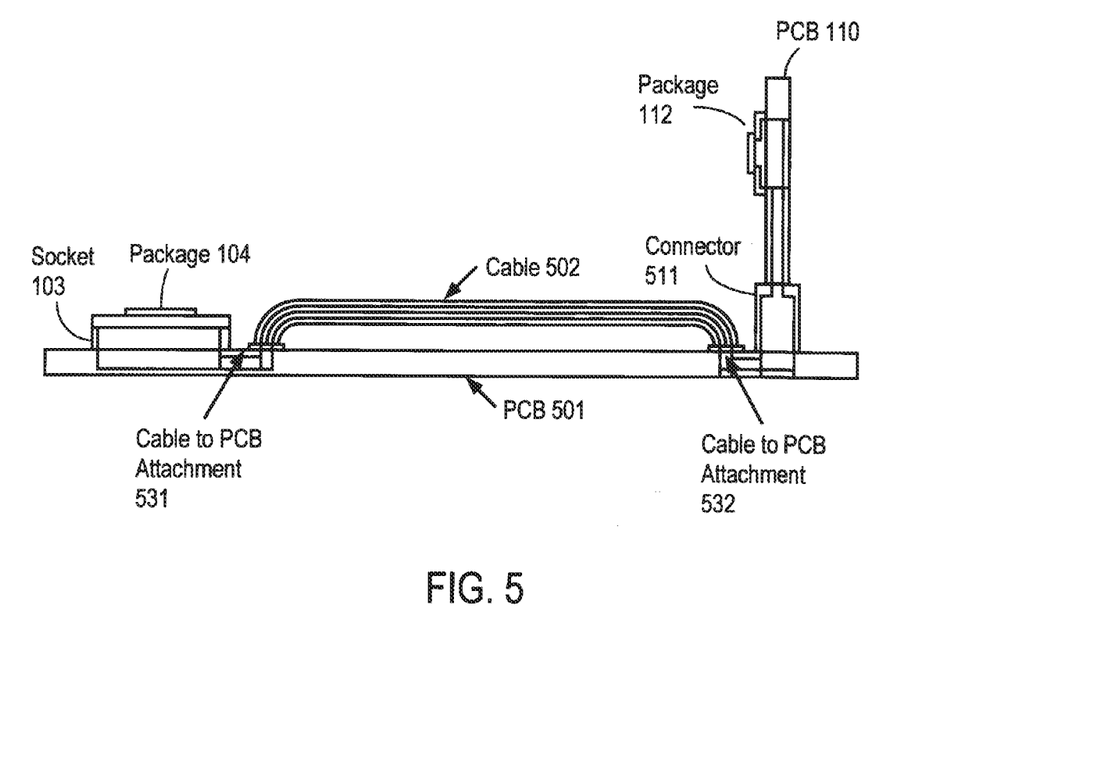
FIG. 5 illustrates one embodiment of a PCI Express topology with an alternative channel on the top side of a substrate (e.g., PCB).

FIG. 5 illustrates one embodiment of a PCI Express topology with an alternative channel on the topside of a substrate (e.g., PCB). Referring to FIG. 5, cable 502 is coupled to PCB 501 via cable to PCB attachment units 531 and 532. Attachment units 531 and 532 may be the same as the cable attachment unit of FIG. 2 or FIG. 3, except that the attachment units 531 couple the cable to traces of PCB 501. In one embodiment, attachment units 531 and 532 couple cable 502 to PCB 501 using a press-fit connection. In another embodiment, the connection is by a surface mount connection. Other well-known connection schemes may be used as well. Also, the connections between attachment units 531 and 532 and PCB 501 may be different in that they are attached using different pin patterns.

In one embodiment, the assembly includes another cable connector to couple the cable at another point (location) on the substrate (e.g., PCB). In one embodiment, the cable connector is a QSFP connector or any cable connector. In one embodiment, the assembly is a switch board with one or more cable connectors mounted at the edge of PCB. In one embodiment, cable connectors are mounted on both top and bottom side of PCB.

Figure 6:
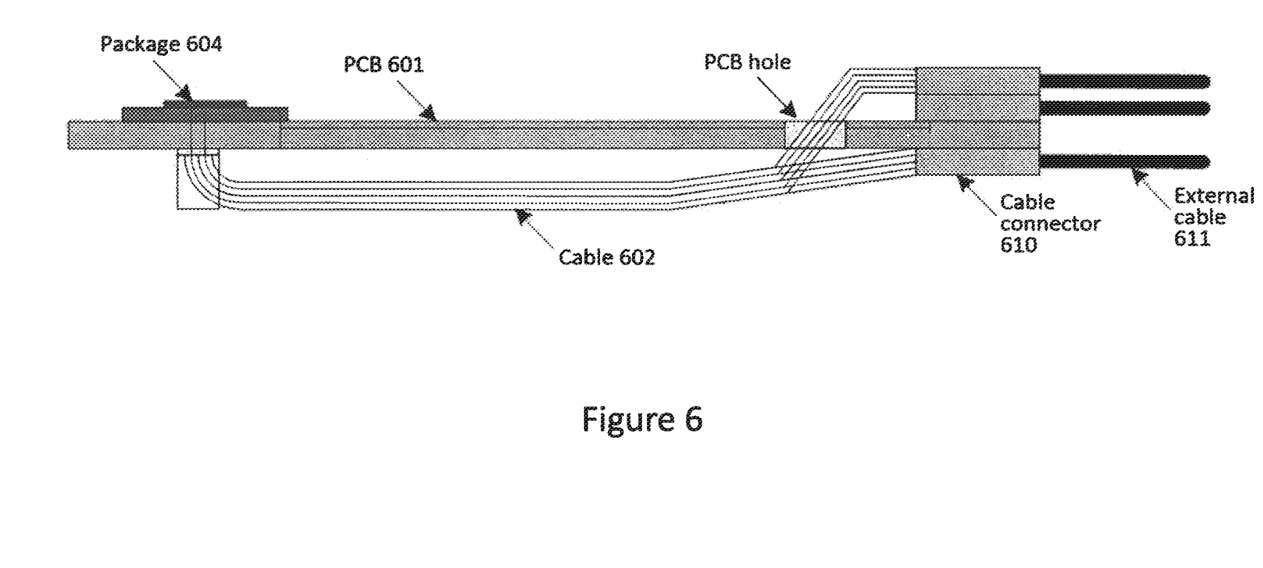
FIG. 6 illustrates one embodiment of a switch board with cable connectors with a coax or twin-ax cable attached to a connector.

FIG. 6 shows another application with coax or twin-ax cable attach to PCB and connector. Coax or twin-ax cable is mounted on the backside of PCB board at package shadow via and the other end of cable is connected to cable connector. Coax or twin-ax cable can be connected to cable connector by modifying cable connector which can plug in coax or twin-ax termination to the back of modified cable connector.

Referring to FIG. 6, a substrate (PCB 601) has a package 604 attached to its top side. On its backside, one end of cable 602 is directly attached to the area beneath package 604 (using a cable attach unit, such as, for example, the cable attach units of FIG. 2 or 3). The other end of cable 602 is coupled to cable connector 610 that is connected to the back side of PCB 601 to communicably couple cable 602 to external cable 611. Such a connection may occur according to one or more well-known interfaces. Two cable connectors are also coupled to the top side of PCB 601.

In one embodiment, the cable attachment in FIG. 6 that is closer to the cable connector could be to one of the connectors on the top side of the PCB. This could be accomplished by having a via in the PCB through which the cable would pass to reach the connector on the top side of the PCB, which is shown in FIG. 6.

Figure 7:
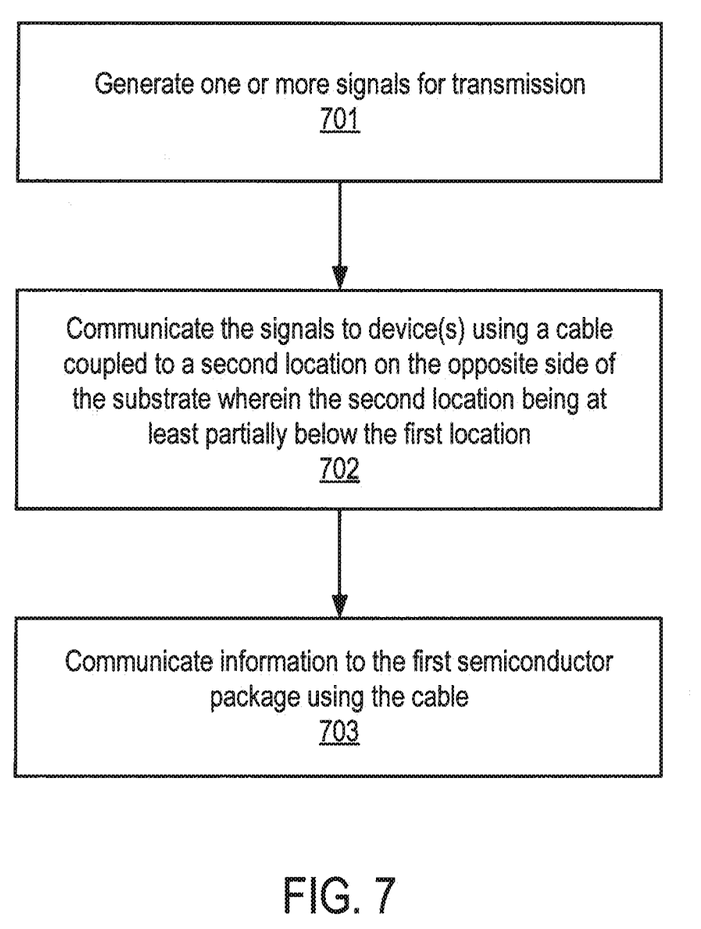
FIG. 7 is a dataflow diagram of one embodiment of a process for employing an interconnect topology described herein.

FIG. 7 is a dataflow diagram of one embodiment of a process for employing an interconnect topology described herein. Referring to FIG. 7, the process begins by a first semiconductor package, coupled to a first location on a first side of a substrate, generating one of more signals for transmission (processing block 701). In response to the generation of the signals, the first semiconductor package communicating the signals to one or more of a plurality of devices using a cable coupled to at a second location on the second side of the substrate, wherein the second location being at least partially below the first location, the first and second sides of the substrate being on opposite sides of the substrate (processing block 702). Next, the process includes the one or more devices communicating information to the first semiconductor package using the cable (processing block 703).

In a first example embodiment, the apparatus comprises a substrate having a first side and a second side, the second side being on an opposite side of the substrate from the first side, the substrate having a first location on the first side at which an semiconductor package is to be coupled; and a cable coupled to the substrate on the second side of the substrate at a second location on the second side, the second location being at least partially below the first location.

In another embodiment, the subject matter of the first example embodiment can optionally include that the cable is coupled to the substrate via a press fit connection in which a plurality of press fit tails of press fit pins extend through a plurality of vias that extend into the substrate.

In another embodiment, the subject matter of the first example embodiment can optionally include that the press fit pins are attached to the second side of the substrate at one or both of a package shadow via or a connector shadow via.

In another embodiment, the subject matter of the first example embodiment can optionally include that the press fit pins couple a socket to the substrate.

In another embodiment, the subject matter of the first example embodiment can optionally include that the second location on the second side opposite a semiconductor package shadow of the semiconductor package.

In another embodiment, the subject matter of the first example embodiment can optionally include that the apparatus further comprises: a connector attached to the substrate; and a cable attachment unit coupled to the connector to couple the cable to the receptacle.

In another embodiment, the subject matter of the first example embodiment can optionally include that the substrate comprises a printed circuit board (PCB).

In another embodiment, the subject matter of the first example embodiment can optionally include the semiconductor package coupled to a first side of the substrate at a first location.

In another embodiment, the subject matter of the first example embodiment can optionally include that a cable connector is coupled to the cable at a third location on the substrate. In a tenth example embodiment, the subject matter of the ninth example embodiment can optionally include that the cable connector is a QSFP connector.

In another embodiment, the subject matter of the first example embodiment can optionally include that the cable comprises a coax or twin-ax cable.

In a second example embodiment, an apparatus comprises a printed circuit board (PCB) having a first side and a second side and a plurality of vias, the second side being on an opposite side of the substrate from the first side, the PCB having a first location on the first side at which an semiconductor package is to be coupled; and a cable coupled to the PCB on the second side of the PCB at a second location on the second side and communicably coupled using a press fit connection in which a plurality of press fit tails of press fit pins extend through the plurality of vias that extend through the PCB, the second location being at least partially below the first location.

In another embodiment, the subject matter of the second example embodiment can optionally include that the press fit pins are attached to the second side of the substrate at one or both of a package shadow via or a connector shadow via.

In another embodiment, the subject matter of the second example embodiment can optionally include a connector attached to the substrate; and a cable attachment unit coupled to the connector to couple the cable to the receptacle.

In another embodiment, the subject matter of the second example embodiment can optionally include the semiconductor package coupled to a first side of the substrate at a first location.

In another embodiment, the subject matter of the second example embodiment can optionally include a cable connector coupled the cable at a third location on the substrate. In one example of this second example embodiment, the cable connector is a QSFP connector.

In another embodiment, the subject matter of the second example embodiment can optionally include that the cable comprises a coax or twin-ax cable.

In a third example embodiment, the apparatus comprises: a substrate having a first side; a semiconductor package coupled to the first side of the substrate; a second semiconductor component coupled to the substrate; a pair of cable attachment units attached to the first side of the substrate; and a cable coupled to the substrate via the pair of cable attachment units.

In another embodiment, the subject matter of the third example embodiment can optionally include that a length of a trace in the substrate between the semiconductor package and the second semiconductor component used for communication therebetween exceeds that which is necessary to meet platform landing zone requirements for the apparatus.

In a fourth example embodiment, the method for communicating information over an interconnect topology comprises: communicating signals from a first semiconductor package coupled to a first location on a first side of a substrate to one or more of a plurality of devices using a cable coupled to at a second location on the second side of the substrate, where the second location is at least partially below the first location, the first and second sides of the substrate being on opposite sides of the substrate; and communicating information to the first semiconductor package from the one or more of a plurality of devices using the cable.

In another embodiment, the subject matter of the fourth example embodiment can optionally include that the cable is coupled to the substrate via a press fit connection in which a plurality of press fit tails of press fit pins extend through a plurality of vias that extend into the substrate.

Whereas many alterations and modifications of the present invention will no doubt become apparent to a person of ordinary skill in the art after having read the foregoing description, it is to be understood that any particular embodiment shown and described by way of illustration is in no way intended to be considered limiting. Therefore, references to details of various embodiments are not intended to limit the scope of the claims which in themselves recite only those features regarded as essential to the invention.

We claim:

1. An apparatus comprising:
    a semiconductor package;
    a substrate coupled to the semiconductor package and having a first side and a second side, the second side being on an opposite side of the substrate from the first side, the substrate having a first location on the first side at which the semiconductor package is coupled; and
    a cable coupled to the substrate on the second side of the substrate at a second location on the second side and electrically coupled to the semiconductor package through the substrate, the second location being at least partially below the first location.

2. The apparatus defined in claim 1 wherein the cable is coupled to the substrate via a press fit connection in which a plurality of press fit tails of press fit pins extend through a plurality of vias that extend through the substrate.

3. The apparatus defined in claim 2 wherein the press fit pins are attached to the second side of the substrate at one or both of a package shadow via or a connector shadow via.

4. The apparatus defined in claim 2 wherein the press fit pins couple a socket to the substrate.

5. The apparatus defined in claim 1 wherein the second location on the second side opposite a semiconductor package shadow of the semiconductor package.

6. The apparatus defined in claim 1 further comprising:
    a connector attached to the substrate; and
    a cable attachment unit coupled to the connector to couple the cable to the receptacle.

7. The apparatus defined in claim 1 wherein the substrate comprises a printed circuit board (PCB).

8. The apparatus defined in claim 1 further comprising the semiconductor package coupled to a first side of the substrate at a first location.

9. The apparatus defined in claim 1 further comprising a cable connector to couple the cable at a third location on the substrate.

10. The apparatus defined in claim 9 wherein the cable connector is a QSFP connector.

11. The apparatus defined in claim 1 wherein the cable comprises a coax or twin-ax cable.

12. An apparatus comprising:
    a semiconductor package;
    a printed circuit board (PCB) having a first side and a second side and a plurality of vias, the second side being on an opposite side of the substrate from the first side, the PCB having a first location on the first side at which the semiconductor package is coupled; and
    a cable coupled to the PCB on the second side of the PCB at a second location on the second side and communicably coupled to the semiconductor package through the PCB using a press fit connection in which a plurality of press fit tails of press fit pins extend through the plurality of vias that extend through the PCB, the second location being at least partially below the first location.

13. The apparatus defined in claim 12 wherein the press fit pins are attached to the second side of the substrate at one or both of a package shadow via or a connector shadow via.

14. The apparatus defined in claim 12 further comprising:
    a connector attached to the substrate; and
    a cable attachment unit coupled to the connector to couple the cable to the receptacle.

15. The apparatus defined in claim 12 further comprising the semiconductor package coupled to a first side of the substrate at a first location.

16. The apparatus defined in claim 12 further comprising a cable connector to coupled the cable at a third location on the substrate.

17. The apparatus defined in claim 16 wherein the cable connector is a QSFP connector.

18. The apparatus defined in claim 12 wherein the cable comprises a coax or twin-ax cable.

19. An apparatus comprising:
    a substrate having a first side;
    a semiconductor package coupled to the first side of the substrate;
    a second semiconductor component coupled to the substrate;
    a pair of cable attachment units attached to the first side of the substrate at locations away from the couplings of the semiconductor package and the second semiconductor component, wherein a first cable attachment unit of the pair is electrically coupled to the semiconductor package and a second cable attachment unit of the pair is electrically coupled to the second semiconductor component; and
    a cable coupled to the substrate via the cable electrically coupling the pair of cable attachment units to each other.

20. The apparatus defined in claim 19 wherein a length of a trace in the substrate between the semiconductor package and the second semiconductor component used for communication therebetween exceeds that which is necessary to meet platform landing zone requirements for the apparatus.

21. A method for communicating information over an interconnect topology, the method comprising:
    communicating signals from a first semiconductor package coupled to a first location on a first side of a substrate through the substrate to one or more of a plurality of devices using a cable coupled to at a second location on the second side of the substrate and electrically coupled to the first semiconductor package, the second location being at least partially below the first location, the first and second sides of the substrate being on opposite sides of the substrate; and
    communicating information to the first semiconductor package from the one or more of a plurality of devices using the cable.

22. The method defined in claim 21 wherein the cable is coupled to the substrate via a press fit connection in which a plurality of press fit tails of press fit pins extend through a plurality of vias that extend into the substrate.

* * * * *